(12) United States Patent
Choi et al.

(10) Patent No.: US 8,026,147 B2
(45) Date of Patent: Sep. 27, 2011

(54) METHOD OF FABRICATING A SEMICONDUCTOR MICROSTRUCTURE

(75) Inventors: Yongsoon Choi, Yongin-si (KR); Kyung-moon Byun, Seoul (KR); Eunkee Hong, Seongnam-si (KR); Eun-kyung Baek, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/856,262

(22) Filed: Aug. 13, 2010

(65) Prior Publication Data

US 2011/0039393 A1    Feb. 17, 2011

(30) Foreign Application Priority Data

Aug. 13, 2009   (KR) .................. 10-2009-0074878

(51) Int. Cl.
*H01L 21/20* (2006.01)
(52) U.S. Cl. ................. 438/386; 257/E21.011
(58) Field of Classification Search .......... 438/386; 257/E21.011
See application file for complete search history.

(56) References Cited

U.S. PATENT DOCUMENTS

| 6,667,209 | B2 * | 12/2003 | Won et al. ............ 438/253 |
| 7,125,766 | B2 * | 10/2006 | Kim et al. ............ 438/253 |
| 2005/0253179 | A1 * | 11/2005 | Park ............... 257/301 |
| 2006/0286745 | A1 * | 12/2006 | Park et al. ............ 438/255 |
| 2007/0111432 | A1 * | 5/2007 | Oh et al. ............ 438/253 |

FOREIGN PATENT DOCUMENTS

| KR | 1020050073211 A | 7/2005 |
| KR | 1020050117713 A | 12/2005 |
| KR | 100654353 B1 | 11/2006 |

* cited by examiner

*Primary Examiner* — Alexander Ghyka
*Assistant Examiner* — Seahvosh J Nikmanesh
(74) *Attorney, Agent, or Firm* — Myers Bigel Sibley & Sajovec, P.A.

(57) ABSTRACT

Provided is a method of fabricating a semiconductor microstructure, the method including forming a lower material layer on a semiconductor substrate, the lower material layer including a nitride of a Group III-element; forming a mold material layer on the lower material layer; forming an etching mask on the mold material layer, the etching mask being for forming a structure in the mold material layer; anisotropic-etching the mold material layer and the lower material layer by using the etching mask; and isotropic-etching the mold material layer and the lower material layer.

11 Claims, 5 Drawing Sheets

METHOD OF FABRICATING A SEMICONDUCTOR MICROSTRUCTURE

CROSS-REFERENCE TO RELATED APPLICATIONS

This application claims the benefit of Korean Patent Application No. 10-2009-0074878, filed on Aug. 13, 2009, in the Korean Intellectual Property Office, the disclosure of which is incorporated herein in its entirety by reference.

BACKGROUND

The inventive concept relates to a method of fabricating a semiconductor microstructure.

A series of operations including stacking various different materials and etching the stacked materials by using a mask may be necessary to fabricate a semiconductor device having a complex microstructure. Here, since there are variable differences in etching characteristics of stacked materials, it is very difficult to obtain a desired microstructure. In particular, when an etchant is used for dry or wet etching, etching characteristics of stacked materials may be significantly affected by combinations of the stacked materials and the etchant, and thus it may be difficult to obtain a desired microstructure with an improper combination of material layers for forming the microstructure and an etchant.

SUMMARY

The inventive concept provides a method of fabricating a semiconductor microstructure, which can be used to obtain various semiconductor microstructures as desired.

According to an aspect of the inventive concept, there is provided a method of fabricating a semiconductor microstructure, the method including forming a lower material layer on a semiconductor substrate, the lower material layer including a nitride of a Group III-element; forming a mold material layer on the lower material layer; forming an etching mask on the mold material layer, the etching mask being for forming a structure in the mold material layer; anisotropic-etching the mold material layer and the lower material layer by using the etching mask; and isotropic-etching the mold material layer and the lower material layer.

Here, the lower material layer may include boron nitride, aluminium nitride, or a mixture thereof.

The method may further include forming a supporting material layer on the mold material layer, prior to the forming of the etching mask. Here, the supporting material layer may include a silicon nitride. Optionally, the supporting material layer may consist of a silicon nitride.

The mold material layer may consist of a silicon oxide.

In the isotropic-etching of the mold material layer and the lower material layer, an etchant including at least one of the group consisting of sulphuric acid ($H_2SO_4$), deionized water, and SC-1 solution may be used for isotropic-etching the mold material layer and the lower material layer.

The structure may be a via hole. Here, the method may selectively further include forming a bottom electrode on the inner surface of the via hole; and sequentially forming a dielectric layer and a top electrode on the bottom electrode.

Selectively, the method may further include forming a supporting material layer on the mold material layer, prior to the forming of the etching mask. Furthermore, in the isotropic-etching of the mold material layer and the lower material layer, an etchant including at least one of the group consisting of sulphuric acid ($H_2SO_4$), deionized water, and SC-1 solution may be used for isotropic-etching the mold material layer and the lower material layer. Furthermore, the lower material layer may be etched faster than the supporting material layer by the etchant.

The lower material layer may be formed by using a chemical vapor deposition (CVD).

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
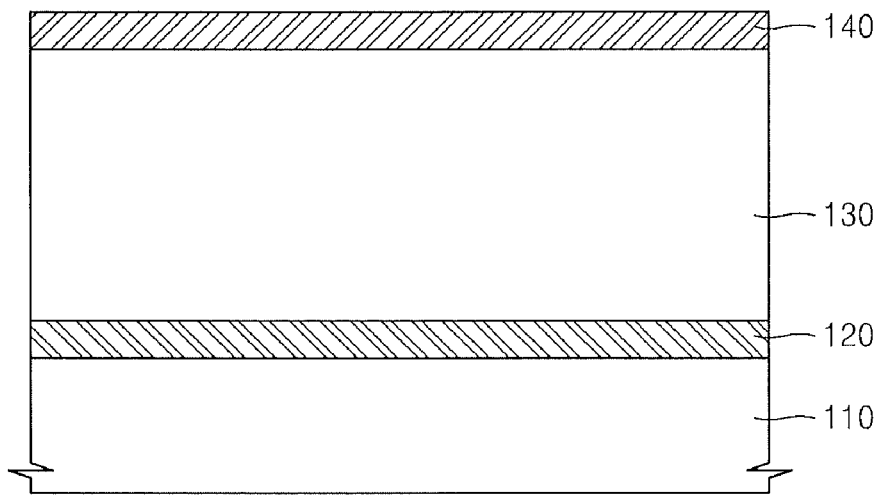
FIGS. 1A through 1D are cross-sectional views illustrating a method of fabricating a semiconductor microstructure, according to an embodiment of the inventive concept.

The inventive concept will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

The inventive concept provides a method of fabricating a semiconductor microstructure, which can be used to obtain a desired semiconductor microstructure.

An embodiment of the inventive concept provides a method of fabricating a semiconductor microstructure, the method including forming a lower material layer, which is formed of a Group III nitride, on a semiconductor substrate; forming a mold material layer on the lower material layer; forming an etching mask for forming a structure in the mold material layer; anisotropic-etching the mold material layer and the lower material layer by using the etching mask; and isotropic-etching the mold material layer and the lower material layer.

FIGS. 1A through 1D are cross-sectional views illustrating a method of fabricating a semiconductor microstructure, according to an embodiment of the inventive concept.

Referring to FIG. 1A, a lower material layer 120 is formed on a semiconductor substrate 110. The lower material layer is a layer formed of a Group III nitride, e.g. boron nitride (BN), aluminium nitride (AlN), or a mixture thereof. However, the inventive concept is not limited thereto. Group III elements for forming the Group III nitride may include boron (B), aluminium (Al), gallium (Ga), indium (In), and thallium (Tl).

In the Group III nitride, a stoichiometric ratio between a Group III element X and nitrogen may be about 1:1. For example, the stoichiometric ratio between a Group III-element X and nitrogen may range from 0.8:1 to 1.2:1.

Furthermore, the Group III nitride may selectively be an oxynitride of a Group III element X. An oxynitride of the Group III element X may be expressed as $X_pO_{1-q}N_q$ ($0.82 \leq p \leq 1.2$ and $0 < q < 1$).

Here, the semiconductor substrate 110 may either be a raw semiconductor material, such as a silicon wafer, or a workpiece, which is a semiconductor material on which either various devices or predetermined structures are already formed.

The lower material layer 120 may be formed by using a method such as a chemical vapor deposition (CVD) method or an atomic layer deposition (ALD) method. In particular, the lower material layer 120 may be formed by using a CVD method.

Referring to FIG. 1A, a mold-material layer 130 is formed on the lower material layer 120. The mold material layer 130 may include a silicon oxide. In detail, the mold material layer 130 may be formed of tetraethyl orthosilicate (TEOS), high density plasma CVD (HDP-CVD) oxide, phosphosilicate glass (PSG), borosilicate glass (BSG), undoped silicate glass (USG), borophosphosilicate glass (BPSG), or spin-on-glass (SOG). The thickness of the mold material layer 130 may be from about 1000 nm to about 3000 nm.

The mold material layer 130 may have a multi-layer structure including two or more materials. For example, the mold material 130 may include a lower layer (not shown) formed of BPSG and an upper layer (not shown) formed of TEOS.

Referring to FIG. 1A, a supporting material layer 140 may be further formed on the mold material layer 130. The supporting material layer 140 is formed to prevent a structure formed later from deformation or collapse, and may be formed of a silicon nitride. The supporting material layer 140 may be formed to have a thickness from about 30 nm to about 200 nm. The supporting material layer 140 may be formed by using a CVD method or an ALD method.

Figure 1B:
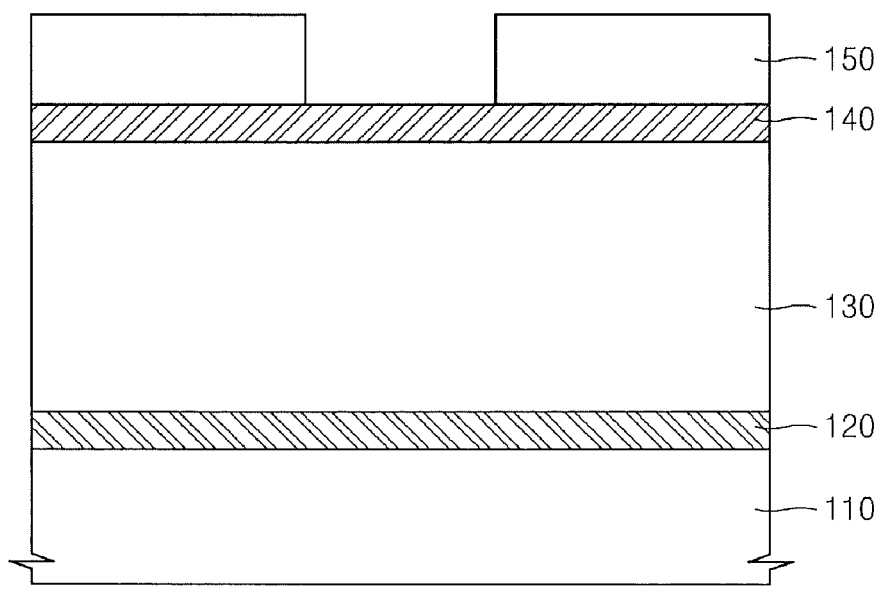

Next, referring to FIG. 1B, an etching mask 150 is formed on the supporting material layer 140. The pattern of the etching mask 150 depends on the shape of a semiconductor microstructure to be formed. In detail, the etching mask 150 may have smaller intervals between patterns than the patterns of a desired semiconductor microstructure, in consideration of isotropic-etching to be performed later. The etching mask 150 may be formed by using a photolithography method. Furthermore, the etching mask 150 may be a hard mask.

Figure 1C:
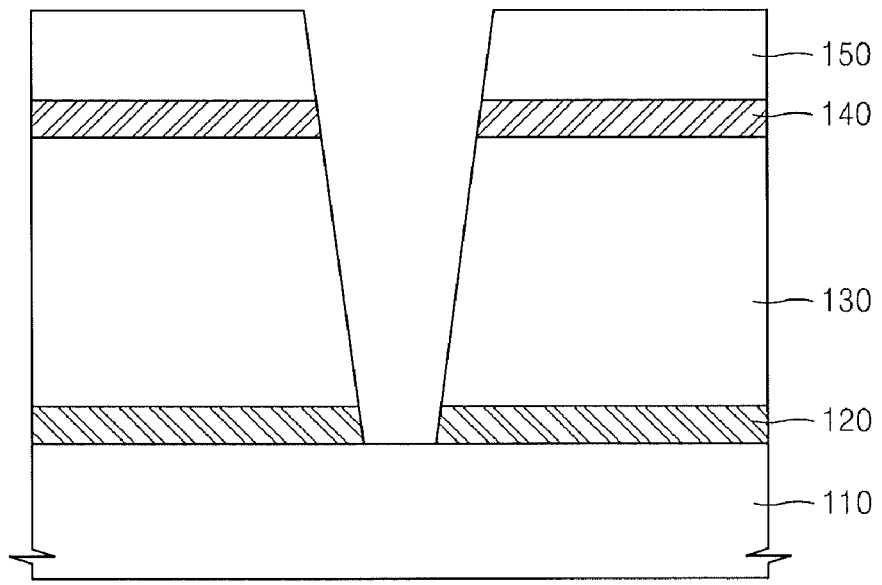

Referring to FIG. 1C, the supporting material layer 140, the mold material layer 130, and the lower material layer 120 are anisotropic-etched by using the etching mask 150. The anisotropic-etching method may be a method well known in the art, and is not limited. In this regard, the anisotropic-etching method may be a plasma etching method. As a result of the anisotropic-etching, a structure as shown in FIG. 1C may be formed, wherein intervals between patterns may not be constant. In this regard, the upper portion of the structure may be etched more than the lower portion of the structure even using the anisotropic-etching method. Therefore the intervals between patterns in the lower portion of the structure may need to be large enough.

Figure 1D:
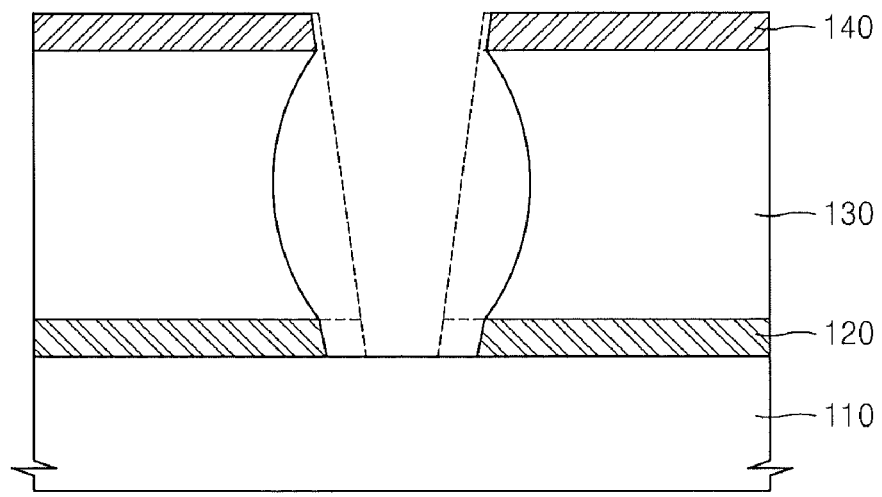

Considering the above, referring to FIG. 1D, intervals between the patterns in the lower portions of the patterns may be enlarged by isotropic-etching the mold material layer 130 and the lower material layer 120. As shown in FIG. 1D, the supporting material layer 140 is barely etched during the isotropic-etching, whereas the mold material layer 130 and the lower material layer 120 are etched more than the supporting material layer 140. Such an etching result may be obtained by selecting an etchant for the isotropic-etching, which etches the lower material layer 120 faster than the supporting material layer 140.

The etchant may be sulphuric acid ($H_2SO_4$), deionized water, or SC-1 solution.

The method of fabricating a semiconductor microstructure described above may be applied to various fields of fabricating semiconductor devices. For example, the method may be applied to fabrication of a capacitor for a semiconductor device. Hereinafter, an example in which the method of fabricating a semiconductor microstructure is applied to fabrication of a capacitor for a semiconductor device will be described in reference to FIGS. 2A through 2E.

Figure 2A:
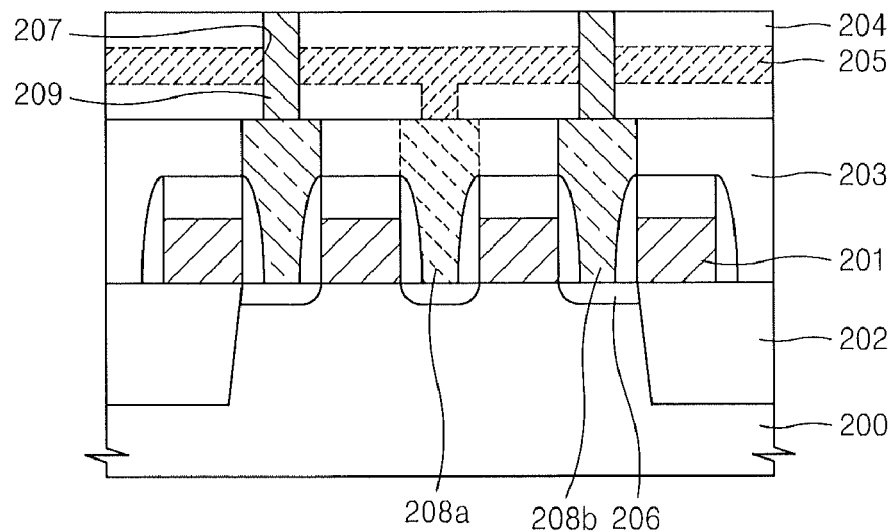
FIG. 2A is a sectional view of a semiconductor memory device on which a capacitor will be formed.

FIG. 2A is a sectional view of a semiconductor memory device on which a capacitor will be formed. Referring to FIG. 2A, a device isolating layer 202 is formed by performing shallow trench isolation (STI) on a semiconductor substrate 200. A transistor, which includes a source/drain region 206 and a gate 201, is formed on the active region of the substrate 200 wherein the active regions are separated by the device isolating layer 202. Next, a first interlayer insulation layer 203 is formed to cover the transistor.

A first pad electrode 208a and a second pad electrode 208b, which contact the source/drain region 206, are formed by partially etching the first interlayer insulation layer 203. During later operations, the first pad electrode 208a is connected to a bitline and the second pad electrode 208b is connected to a capacitor.

A bitline 205, which is connected to the first pad electrode 208a, is formed on the first interlayer insulation layer 203. Next, a second interlayer insulation layer 204 is formed to cover the bitline 205.

A contact hole 207, which exposes the second pad electrode 208b, is formed by partially etching the second interlayer insulation layer 204. Next, a contact plug 209, which is to be connected to a bottom electrode of a capacitor, is formed by filling the contact hole 207 with a conductive material and planarizing the conductive material. The contact plug 209 may be formed of a poly-silicon material.

Figure 2B:
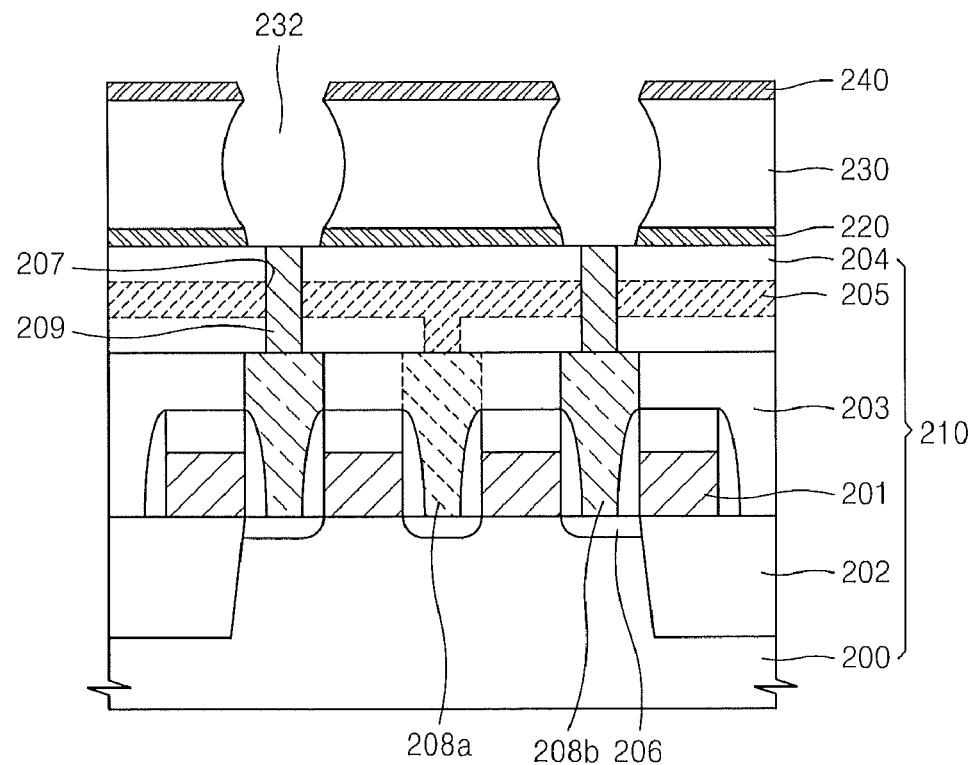
FIGS. 2B through 2E are sectional views illustrating a method of fabricating a capacitor on the semiconductor memory device shown in FIG. 2A.

FIGS. 2B through 2E are sectional views illustrating a method of fabricating a capacitor on the semiconductor memory device 210 shown in FIG. 2A. Referring to FIG. 2B, a semiconductor microstructure formed on the semiconductor memory device 210 may include a via hole 232, which is defined by a lower material layer 220, a mold material layer 230, and a supporting material layer 240, and may be formed by using the method illustrated in FIGS. 1A through 1D. Here, the semiconductor memory device 210 may correspond to the semiconductor substrate 110 of FIGS. 1A through 1D. A detailed description of the method of fabricating the semiconductor microstructure has been provided above and thus will not be repeated.

Figure 2C:
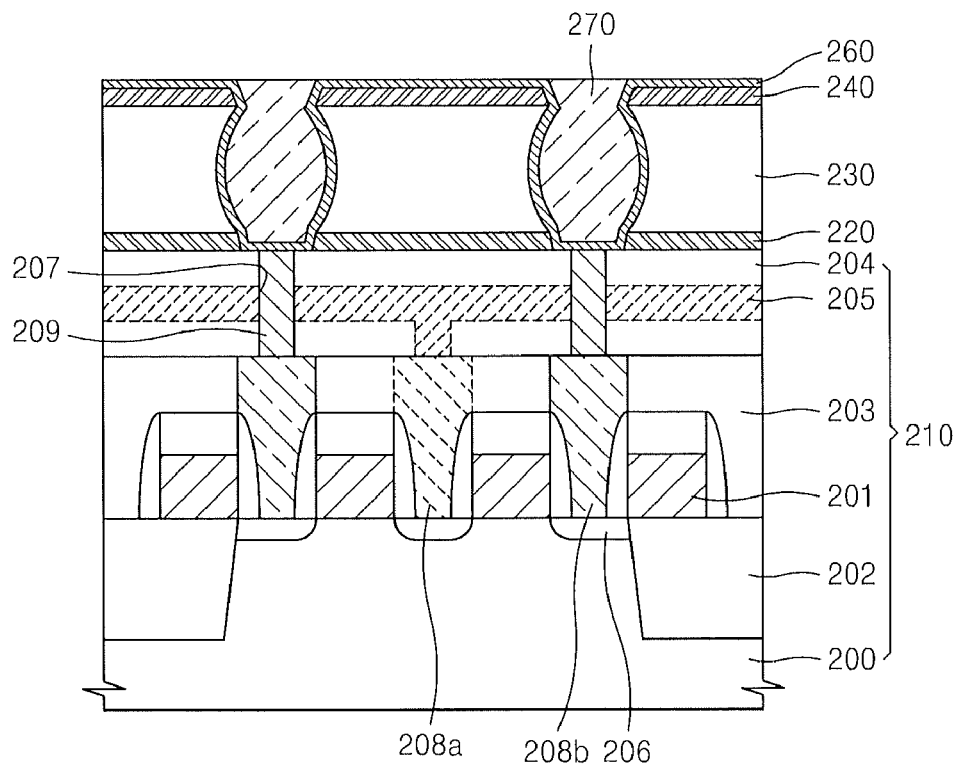

Referring to FIG. 2C, a conductive layer 260 to be formed into a bottom electrode may be formed on the inner surface of the via hole 232 and on the top surface of supporting material layer 240. The conductive layer 260 may be formed of poly-silicon which is heavily doped with either an n-type or a p-type impurity, and may be formed using a low pressure CVD. (LP CVD) operation and a doping operation, such that the conductive layer 260 has a uniform thickness. The conductive layer 260 may be formed of a conductive metal or a material containing a conductive metal. If the conductive layer 260 is formed of a conductive metal or a material containing a conductive metal, no depletion layer is formed at the interface between a bottom electrode and a dielectric layer that are formed in later operations, and thus capacitance of a capacitor may be increased. In detail, the conductive layer 260 may include at least one selected from the group consisting of platinum (Pt), rhodium (Rh), ruthenium (Ru), iridium (Ir), osmium (Os), palladium (Pd), $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, copper (Cu), aluminium (Al), tantalum (Ta), molybdenum (Mo), tungsten (W), gold (Au), silver (Ag), $WSi_x$, $TiSi_x$, $MoSi_x$, $CoSi_x$, $NoSi_x$, $TaSi_x$, TiN, TaN, WN, TiSiN, TiAlN, TiBN, ZrSiN, ZrAlN, MoSiN, MoAlN, TaSiN, TaAlN and a combination thereof.

A sacrificial layer 270 is formed on the conductive layer 260 to sufficiently cover the via hole 232. The sacrificial layer 270 may be formed of TEOS, HDP-CVD oxide, PSG, USG, BPSG, or SOG, and may be formed of the same material as the mold material layer 230. The sacrificial layer 270 is formed to protect the bottom electrode while the conductive layer 260 is separated to form the bottom electrode 260a.

Figure 2D:
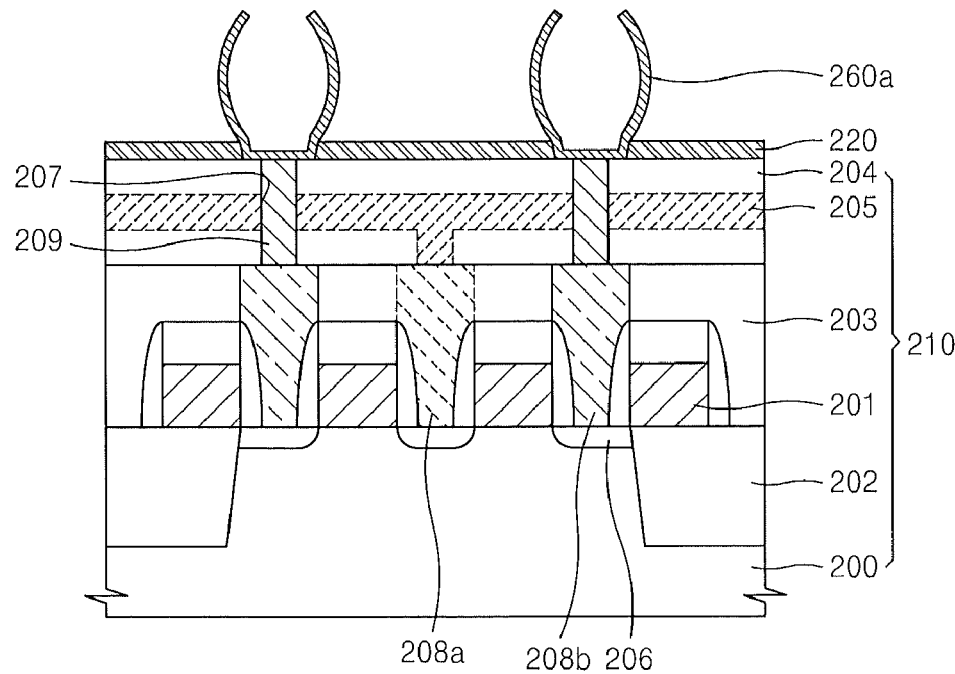

Referring to FIG. 2D, the portion of the conductive layer 260 formed on the supporting material layer 240 is removed by etching back the conductive layer 260 and the sacrificial layer 270, and thereby node separation for the bottom electrode 260a is achieved. As a result of the etch back, a portion of the conductive layer 260 only remains on the inner surface of the via hole 232, and thus a cylindrical bottom electrode 260a is obtained. The etch back may be performed by using a dry etching method, such as a plasma etching method.

Next, the supporting material layer 240 which surround the bottom electrode 260a, the mold material layer 230, and the remaining portion of the sacrificial layer 270 are removed. The supporting material layer 240, the mold material layer 230, and the sacrificial layer 270 may be removed by using a wet-etching method using an etchant. In detail, a wet etching method using an etchant containing hydrofluoric acid, an etchant containing ammonium hydroxide, hydrogen peroxide, and deionized water, or an etchant containing ammonium fluoride, hydrofluoric acid, and distilled water may be used.

As described above, outer sidewalls of the bottom electrode 260a may be exposed by removing the supporting material layer 240, the mold material layer 230, and the sacrificial layer 270. Total area of exposed surfaces of the bottom electrode 260a including inner surfaces thereof as well as the outer sidewall area of the bottom electrode 260a constitutes an effective surface area for a capacitor to be formed. Thus, it is important to secure a sufficiently large total surface area of the bottom electrode 260a. In this regard, the diameter of the cylindrical bottom electrode 260a to be formed may be increased by performing isotropic-etching as shown in FIG. 1D, and thus the total surface area of the bottom electrode 260a may be increased. Furthermore, the total area of the bottom surface of the bottom electrode 260 may be sufficiently increased by forming the lower material layer 220 of a nitride of a Group III element and using an etchant, such as $H_2SO_4$, deionized water, or SC-1, for isotropic etching. As a result, misalignment of the bottom electrode 260a and the contact plug 209, which is formed on the bottom surface of the bottom electrode 260a, may be prevented.

Figure 2E:
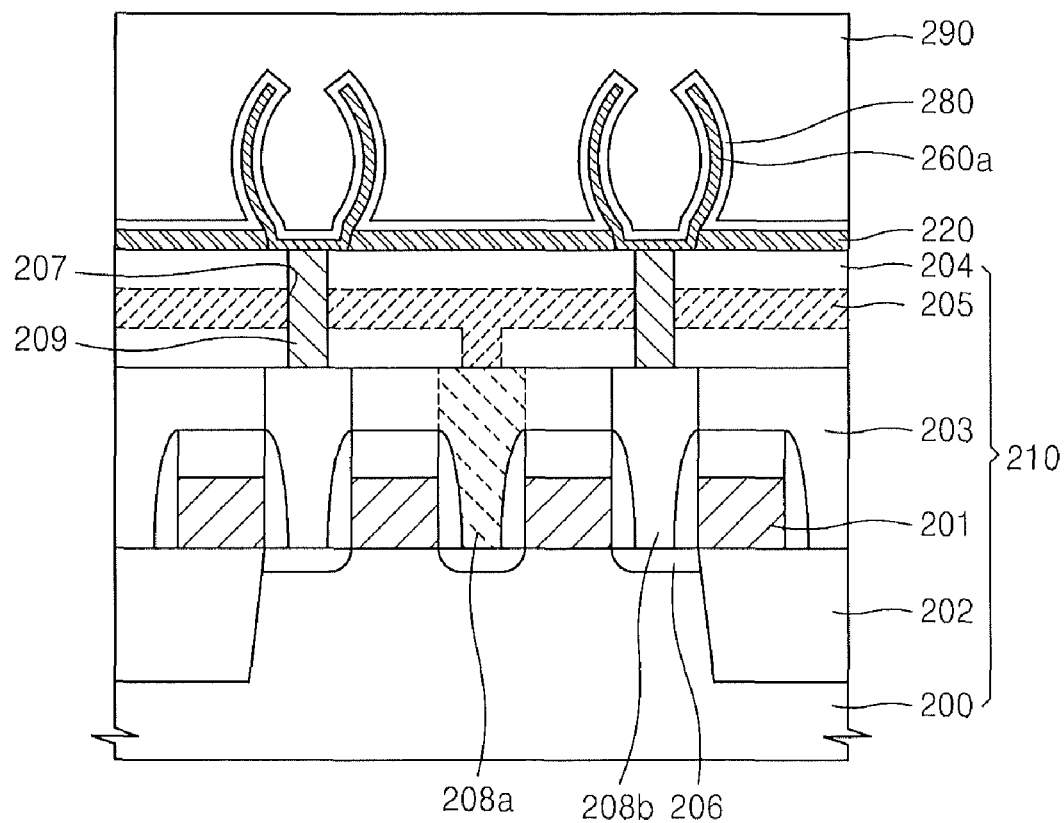

Referring to FIG. 2E, a dielectric layer 280 may be formed on the lower material layer 220 and on the surface of the bottom electrode 260a. The dielectric layer 280 may be formed by depositing a material having high permittivity. For example, the dielectric layer 280 may be formed by conformally depositing a material having high permittivity onto the lower material layer 220 and the bottom electrode 260a by using a CVD method. The material having high permittivity for forming the dielectric layer 280 may have a single layer structure formed of a metal oxide such as aluminium oxide ($Al_2O_3$), hafnium oxide ($HfO_2$), or tantalum oxide ($Ta_2O_5$), or have a multi-layer structure formed of $Ta_2O_5$/titanium oxide or $Al_2O_3$/titanium oxide.

Next, a top electrode 290 may be formed on the dielectric layer 280. The top electrode 290 may be formed of polysilicon, a metal, or a material containing a metal. The top electrode 290 may be formed by depositing a metal or a material containing a metal and stacking polysilicon thereon. If the top electrode 290 is formed of a metal which may be diffused, a barrier layer (not shown) for preventing diffusion of the metal may be further formed prior to formation of the top electrode 290.

Although an embodiment of forming a capacitor is described above, a method of fabricating a semiconductor microstructure according to the inventive concept is not limited thereto, and semiconductor microstructures having various structures may be fabricated as desired in cases where a lower material layer, such as an etching stop layer, exists.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor microstructure, the method comprising:
    forming a lower material layer on a semiconductor substrate, the lower material layer comprising a nitride of a Group III-element;
    forming a mold material layer on the lower material layer;
    forming an etching mask on the mold material layer, the etching mask being for forming a structure in the mold material layer;
    anisotropic-etching the mold material layer and the lower material layer by using the etching mask; and
    isotropic-etching the mold material layer and the lower material layer.

2. The method of claim 1, wherein the lower material layer comprises boron nitride, aluminum nitride, or a mixture thereof.

3. The method of claim 1, further comprising forming a supporting material layer on the mold material layer, prior to the forming of the etching mask.

4. The method of claim 3, wherein the supporting material layer comprises a silicon nitride.

5. The method of claim 3, wherein the supporting material layer consists of a silicon nitride.

6. The method of claim 1, wherein the mold material layer comprises a silicon oxide.

7. The method of claim 1, wherein, in the isotropic-etching of the mold material layer and the lower material layer, an etchant comprising at least one of the group consisting of sulphuric acid ($H_2SO_4$), deionized water, and SC-1 solution is used for isotropic-etching the mold material layer and the lower material layer.

8. The method of claim 1, wherein the structure is a via hole.

9. The method of claim 8, further comprising:
    forming a bottom electrode on the inner surface of the via hole; and
    sequentially forming a dielectric layer and a top electrode on the bottom electrode.

10. The method of claim 1, further comprising forming a supporting material layer on the mold material layer, prior to the forming of the etching mask,
    in the isotropic-etching of the mold material layer and the lower material layer, an etchant comprising at least one of the group consisting of sulphuric acid ($H_2SO_4$), deionized water, and SC-1 solution is used for isotropic-etching the mold material layer and the lower material layer, and the lower material layer is etched faster than the supporting material layer by the etchant.

11. The method of claim 1, wherein the lower material layer is formed by using a chemical vapor deposition (CVD) method.

* * * * *